(12) United States Patent
Chen et al.

(10) Patent No.: US 7,777,284 B2
(45) Date of Patent: Aug. 17, 2010

(54) METAL-OXIDE-SEMICONDUCTOR TRANSISTOR AND METHOD OF FORMING THE SAME

(75) Inventors: Neng-Kuo Chen, Hsin-Chu (TW); Chien-Chung Huang, Tai-Chung Hsien (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 472 days.

(21) Appl. No.: 11/754,362

(22) Filed: May 28, 2007

(65) Prior Publication Data

US 2008/0296631 A1 Dec. 4, 2008

(51) Int. Cl.
*H01L 29/82* (2006.01)
*H01L 21/00* (2006.01)

(52) U.S. Cl. ......................................... 257/415; 438/50
(58) Field of Classification Search .................. 257/288, 257/347, 414–420, E21.006, E21.177; 438/50–52
See application file for complete search history.

(56) References Cited

U.S. PATENT DOCUMENTS 6,573,172 B1 * 6/2003 En et al. ..................... 438/626
7,442,597 B2 * 10/2008 Tsui et al. ................... 438/199

* cited by examiner

*Primary Examiner*—Calvin Lee
(74) *Attorney, Agent, or Firm*—Winston Hsu

(57) ABSTRACT

A method of forming a metal-oxide-semiconductor (MOS) transistor device is disclosed. A semiconductor substrate is prepared first, and the semiconductor substrate has a gate structure, a source region and a drain region. Subsequently, a stress buffer layer is formed on the semiconductor substrate, and covers the gate structure, the source region and the drain region. Thereafter, a stressed cap layer is formed on the stress buffer layer, and a tensile stress value of the stressed cap layer is higher than a tensile stress value of the stress buffer layer. Since the stress buffer layer can prevent the stressed cap layer from breaking, the MOS transistor device can be covered by a stressed cap layer having an extremely high tensile stress value in the present invention.

13 Claims, 21 Drawing Sheets

METAL-OXIDE-SEMICONDUCTOR TRANSISTOR AND METHOD OF FORMING THE SAME

BACKGROUND OF THE INVENTION

1. Field of the Invention

The present invention generally relates to the field of metal-oxide-semiconductor (MOS) transistors, and more particularly, to a method for forming MOS transistors having strained silicon.

2. Description of the Prior Art

A metal-oxide-semiconductor is a common electrical device used in integrated circuits. The MOS transistor is a semiconductor component, usually formed by a gate, a source and a drain. By utilizing channel effects generated by the gate of the MOS under different gate voltages, the MOS is often made to function as a digitalized solid switch applied on various integrated circuits of memory or logic devices.

Please refer to FIGS. 1-3, where FIGS. 1-3 are schematic diagrams illustrating a prior art method of fabricating a MOS transistor. As shown in FIG. 1, a semiconductor substrate 10 is first prepared. A gate dielectric layer 14 and a gate 12 positioned on the dielectric layer 14 are formed on the semiconductor substrate 10, where the gate dielectric layer 14 and the gate 12 form a gate structure. Subsequently, a shallow-junction source extension 17 and a shallow-junction drain extension 19 are formed within the semiconductor substrate 10 on the opposite sides of the gate structure 12. The shallow-junction source extension 17 and the shallow-junction drain extension 19 are separated by a channel region 22 of the MOS transistor. For an N-type metal-oxide-semiconductor (NMOS) transistor, the dopant species of the shallow-junction source extension 17 and the shallow-junction drain extension 19 may be N-type dopant species, such as arsenic, antimony or phosphorous. Next, a liner 30 and a spacer 32 are formed around the sidewall of the gate 12.

As shown in FIG. 2, an ion implantation process is afterward carried out to implant dopants into the semiconductor substrate 10. Accordingly, a source region 18 and a drain region 20 are formed on opposite sides of the gate 12 within the semiconductor structure 10, thereby forming a MOS transistor 34. As mentioned above, the dopant species may be N-type dopant species, such as arsenic, antimony or phosphorous, for the NMOS transistor.

Furthermore, as shown in FIG. 3, a stressed cap layer 46 is formed to cover the surface of the MOS transistor 34. The stressed cap layer 46 consists mainly of silicon nitride, and the thickness of the stressed cap layer 46 is in a range from 10 angstroms to 3000 angstroms so as to provide a tensile stress on the MOS transistor 34. Next, an activating process is performed on the stressed cap layer 46 to make the MOS transistor 34 memorize the stress and at the same time to expand the lattice arrangement in the channel region 22 of the semiconductor substrate 10 underneath the gate dielectric layer 14.

As known to those skilled in this art, higher the stress of the stressed cap layer 46 is, more effectively the stress of the stressed cap layer 46 can expand the lattice arrangement in the channel region 22 of the semiconductor substrate 10. Accordingly, the ion gain of the MOS transistor 34 should be increased as well. However, the stress of the stressed cap layer 46 might crack or break the structure of the MOS transistor 34 in fact when the stress of the stressed cap layer 46 goes beyond a limit. Thereafter, the function of the stressed cap layer 46 is a lot defeated, and the ion gain of the MOS transistor 34 is smaller than the expected ion gain.

Please refer to FIG. 4 and FIG. 5, where FIG. 4 is a schematic chart illustrating a relationship between the tensile stress of the prior art stress cap layer 46 and the ion gain of the prior art MOS transistor 34, and FIG. 5 is a cross-sectional schematic diagram illustrating the prior art stress cap layer 46 having a high tensile stress. As shown in FIG. 4, when the tensile stress of the stressed cap layer 46 is below 1.52 Giga pascals (GPa), the ion gain of the MOS transistor 34 is mainly proportional to the tensile stress of the stress cap layer 46. When the tensile stress of the stressed cap layer 46 goes beyond 1.52 GPa, the ion gain difference is relatively smaller under the same tensile stress difference. When the tensile stress of the stressed cap layer 46 goes beyond 1.65 GPa, cracks appear commonly in the stress cap layer 46 structure, and the ion gain of the MOS transistor 34 decreases immediately. Therefore, the stressed cap layer 46 having tensile stress beyond 1.65 GPa is inferior to the stressed cap layer 46 having tensile stress about 1.60 Gpa. As shown in FIG. 5, when the tensile stress of the stressed cap layer 46 is approximately 1.65 GPa, cracks appear in the stress cap layer 46 structure. Since the stressed cap layer 46 has turning points at the joints between the gate structure and the semiconductor substrate 10, the cracks likely appear at the turning points, and defeat the operating efficiency of the MOS transistor 34.

SUMMARY OF THE INVENTION

It is the primary object of the present invention to provide a method for forming a MOS transistor. Accordingly, a stress buffer layer is first formed on a semiconductor substrate, and a stressed cap layer having high stress is thereafter formed on the surface of the stress buffer layer to change the stress of the channel region so that the MOS transistor has a better operating efficiency.

According to the present invention, a method of forming a MOS transistor is disclosed. First, a semiconductor substrate and two gate structures disposed on the semiconductor substrate are provided. The semiconductor substrate defines a first active region and a second active region therein, and the two gate structures are positioned in the first active region and the second active region respectively. Each of the active regions includes a source region and a drain region on two opposite sides of the gate structure in the semiconductor substrate respectively. Subsequently, a self-aligned silicide (salicide) process is performed. Next, a stress buffer layer is formed on the semiconductor substrate, the gate structures, the source regions and the drain regions. Furthermore, a stressed cap layer is formed on the stress buffer layer, and a tensile stress of the stressed cap layer is larger than a tensile stress of the stress buffer layer.

From one aspect of the present invention, a MOS transistor is disclosed. The MOS transistor includes a semiconductor substrate, a gate structure positioned on the semiconductor substrate, a source region positioned in the semiconductor substrate, a drain region positioned in the semiconductor substrate, a channel region disposed in the semiconductor substrate under the gate structure between the source region and the drain region, a stress buffer layer covering the gate structure, the source region and the drain region, and a stressed cap layer covering the stress buffer layer. A tensile stress of the stressed cap layer is larger than a tensile stress of the stress buffer layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
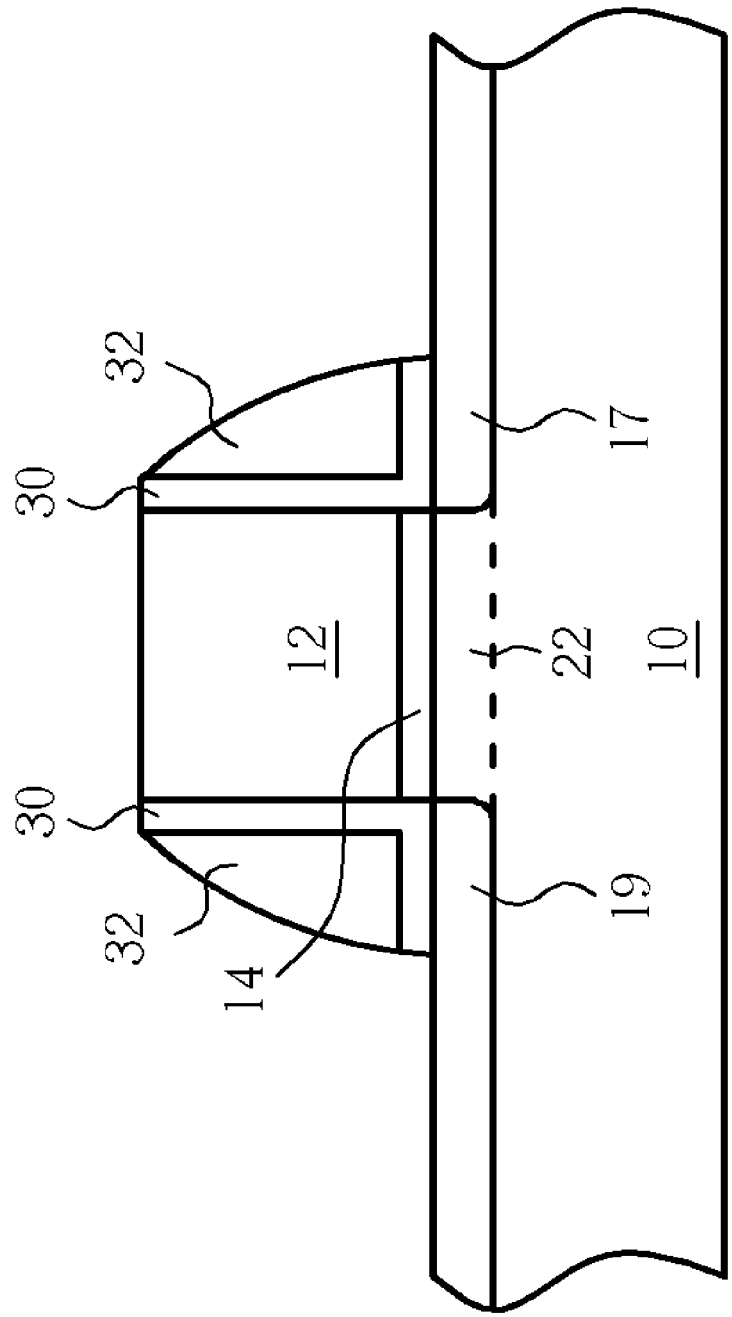
FIGS. 1-3 are schematic diagrams illustrating a prior art method of fabricating a MOS transistor.
Figure 2:
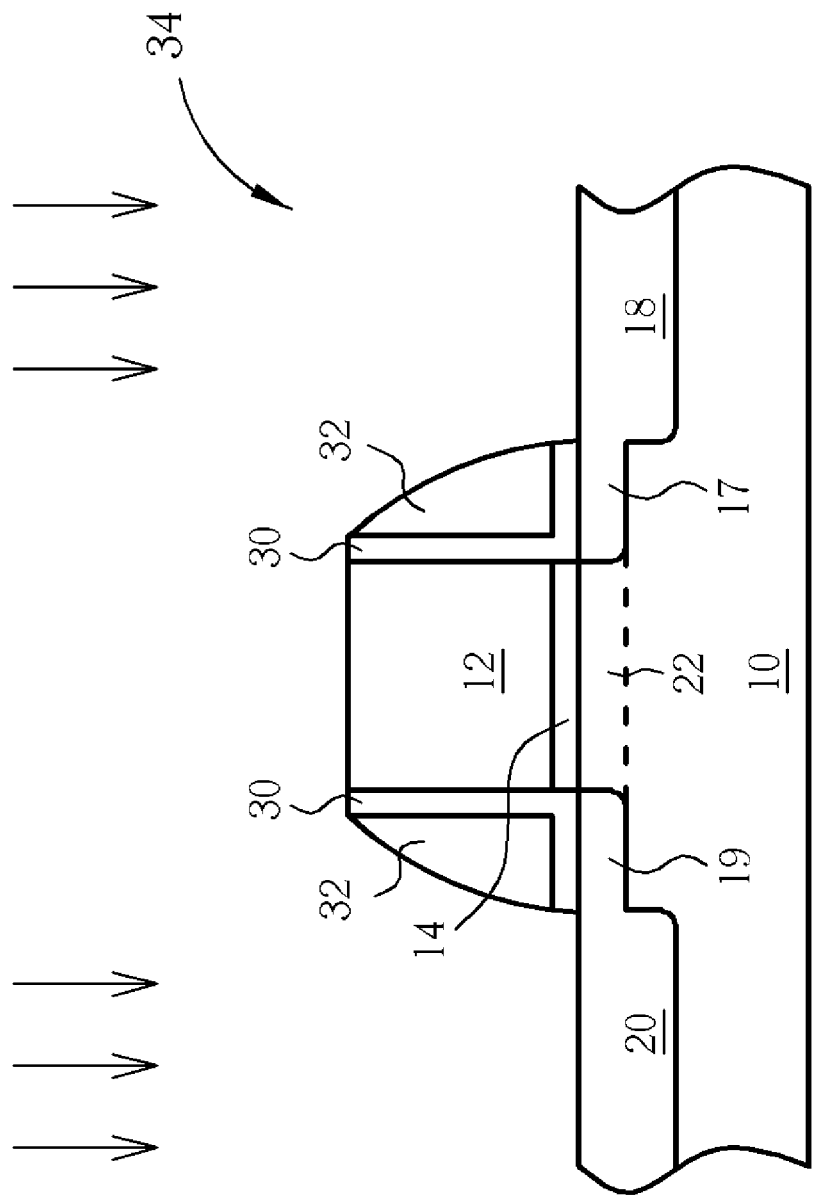
Figure 3:
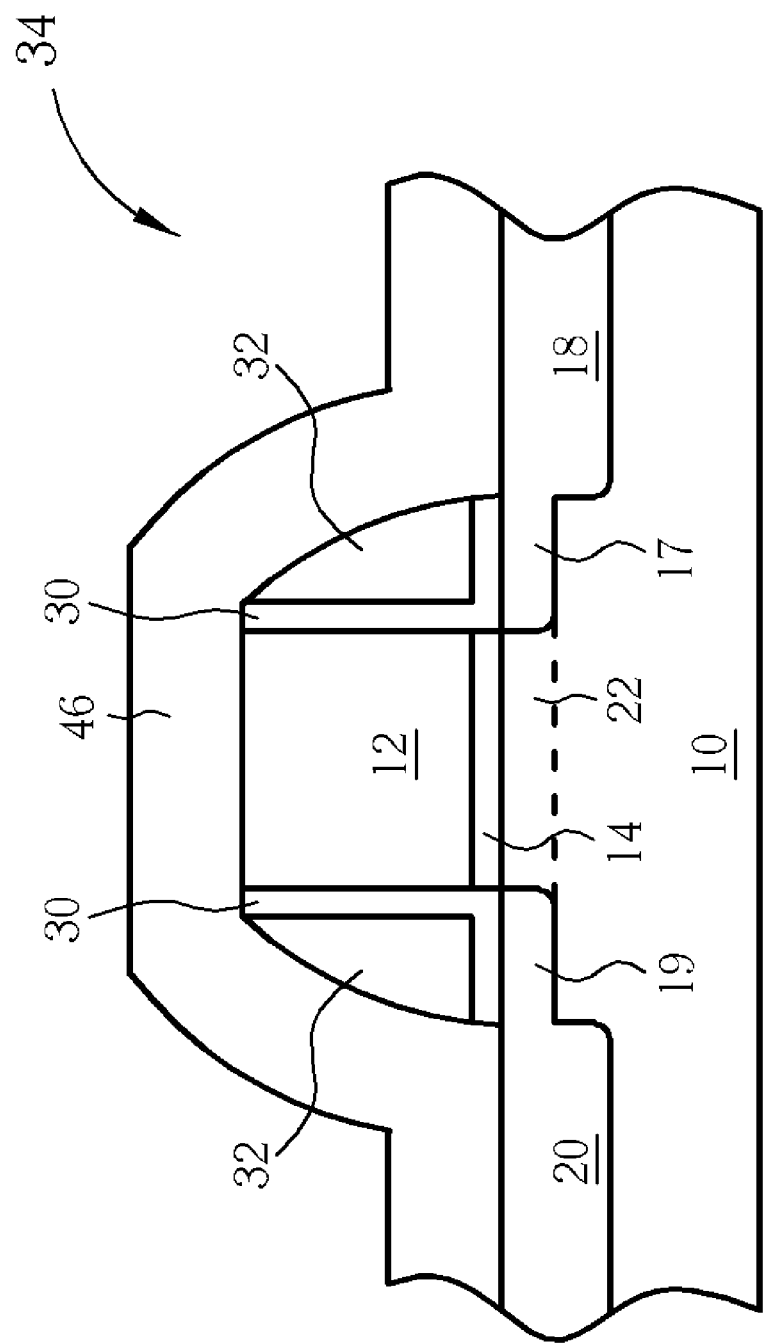
Figure 4:
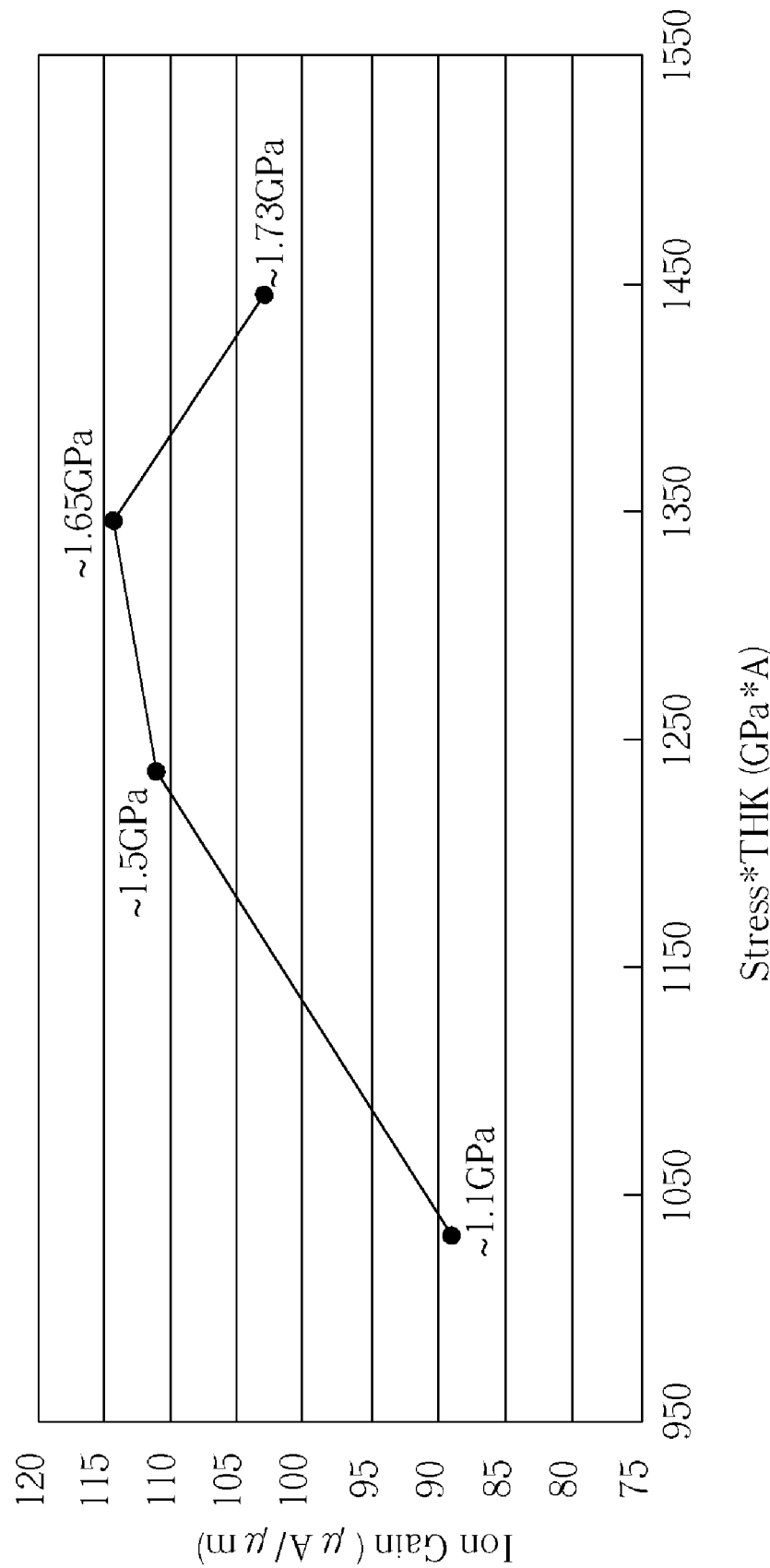
FIG. 4 is a schematic chart illustrating a relationship between the tensile stress of the prior art stress cap layer and the ion gain of the prior art MOS transistor.
Figure 5:
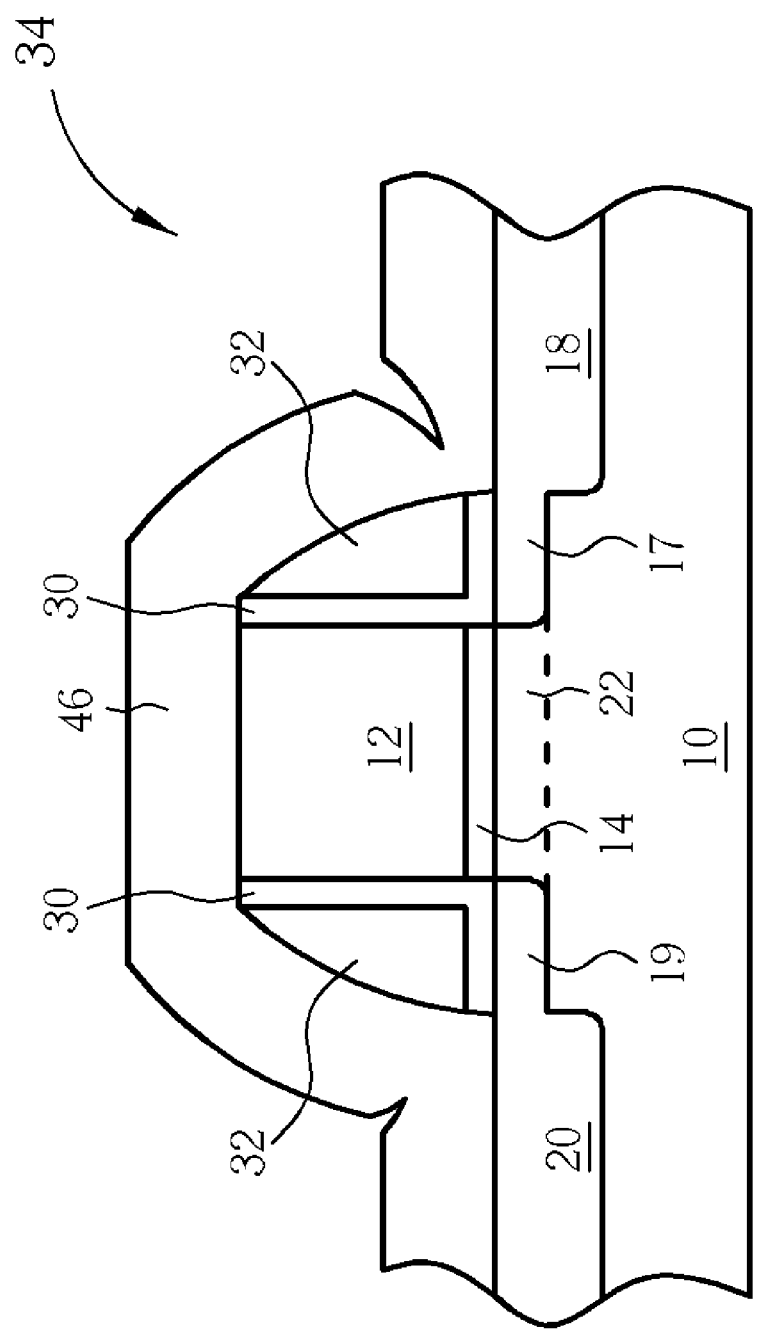
FIG. 5 is a cross-sectional schematic diagram illustrating the prior art stress cap layer having a high tensile stress.

The present invention pertains to a method of fabricating a MOS transistor, such an N-type MOS (NMOS) transistor, a P-type MOS (PMOS) transistor or a complementary MOS (CMOS) device, used in integrated circuits.

Please refer to FIGS. 6-13. FIGS. 6-13 are schematic cross-sectional diagrams illustrating a method of fabricating MOS transistors in accordance with a first preferred embodiment of the present invention, wherein like number numerals designate similar or the same parts, regions or elements. It is to be understood that the drawings are not drawn to scale and are served only for illustration purposes. It is also to be understood that some lithographic and etching processes relating to the present invention method are known in the art and thus not explicitly shown in the drawings.

Figure 6:
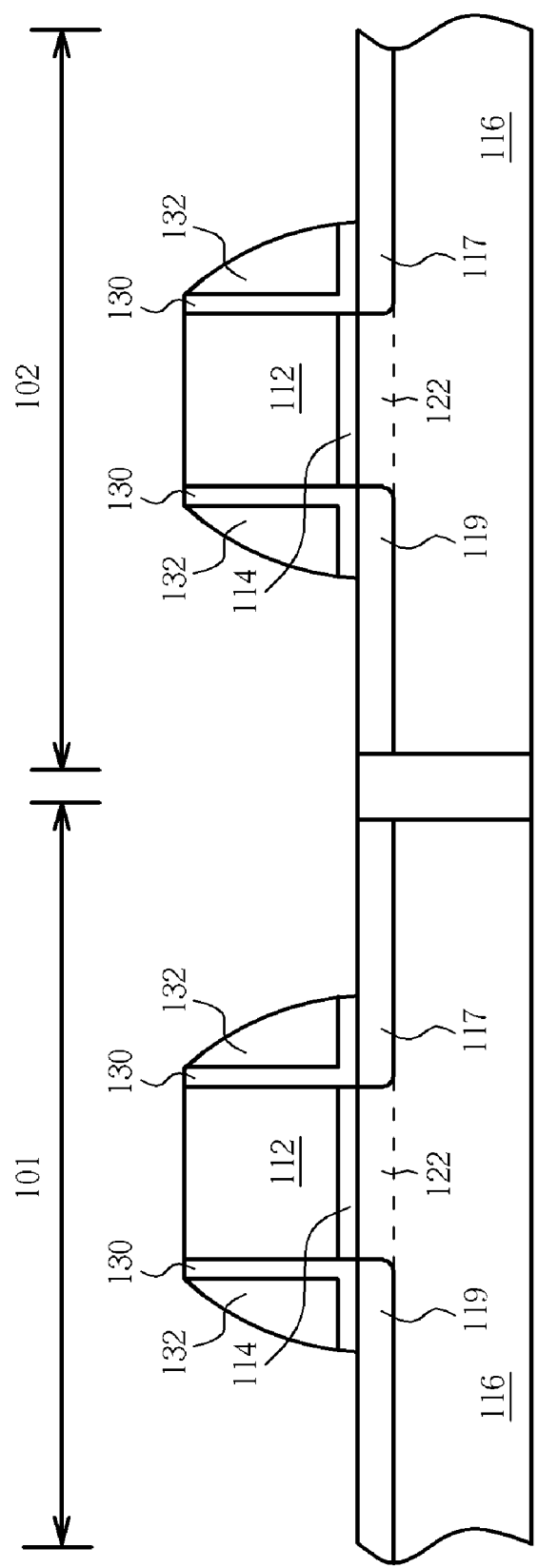
FIGS. 6-13 are schematic cross-sectional diagrams illustrating a method of fabricating MOS transistors in accordance with a first preferred embodiment of the present invention.

As shown in FIG. 6, a semiconductor substrate 110 is prepared. The semiconductor substrate 110 may be a silicon-containing substrate or a silicon-on-insulator (SOI) substrate, but not limited thereto. A first active region 101 and a second active region 102 are defined in the semiconductor substrate 110, where MOS transistors formed in the first active region 101 can be NMOS transistors, and MOS transistors formed in the second active region 102 can be PMOS transistors.

A gate dielectric layer 114 and a gate 112 positioned on the gate dielectric layer 114 are formed on the semiconductor substrate 110 in each active region, such as the first active region 101 and the second active region 102. A gate dielectric layer 114 and the corresponding gate 112 can form a gate structure. The gates 112 generally include conductive materials, such as doped polysilicon, and the gate dielectric layers 114 may be made of high-k materials, such as silicon dioxide or silicon nitride. A shallow-junction source extension 117 and a shallow-junction drain extension 119 are thereafter formed on the opposite sides of each gate 112 within the semiconductor substrate 110, where each source extension 117 and the corresponding drain extension 119 are separated by a channel region 122 of a MOS transistor 134 or a MOS transistor 136. The implanting mask and the ion implantation process for forming the source extension 117 and the corresponding drain extension 119 disposed in the first active region 101 are different from the implanting mask and the ion implantation process for forming the source extension 117 and the corresponding drain extension 119 disposed in the second active region 102. For example, an N-type ion implantation process can be first carried out on the first active region 101, and a P-type ion implantation process can be afterward performed on the second active region 102.

Two material layers (not shown in the figures) are formed by chemical vapor deposition (CVD) processes to cover the gates 112 and the semiconductor substrate 110. An anisotropic etching process is subsequently performed on the material layers to turn the two material layers into liners 130 and spacers 132. Each of the liners 130 is positioned around the sidewall of each gate 112, and each of the spacers 132 is positioned on the sidewall of the corresponding liner 130. The liners 130 are typically L shaped, and may further include an offset spacer. A liner including an offset spacer is known in the art and is thus omitted in the figures. The liners 130 may include silicon oxide, and the spacers 132 may include a silicon nitride compound or a silicon oxide compound.

Figure 7:
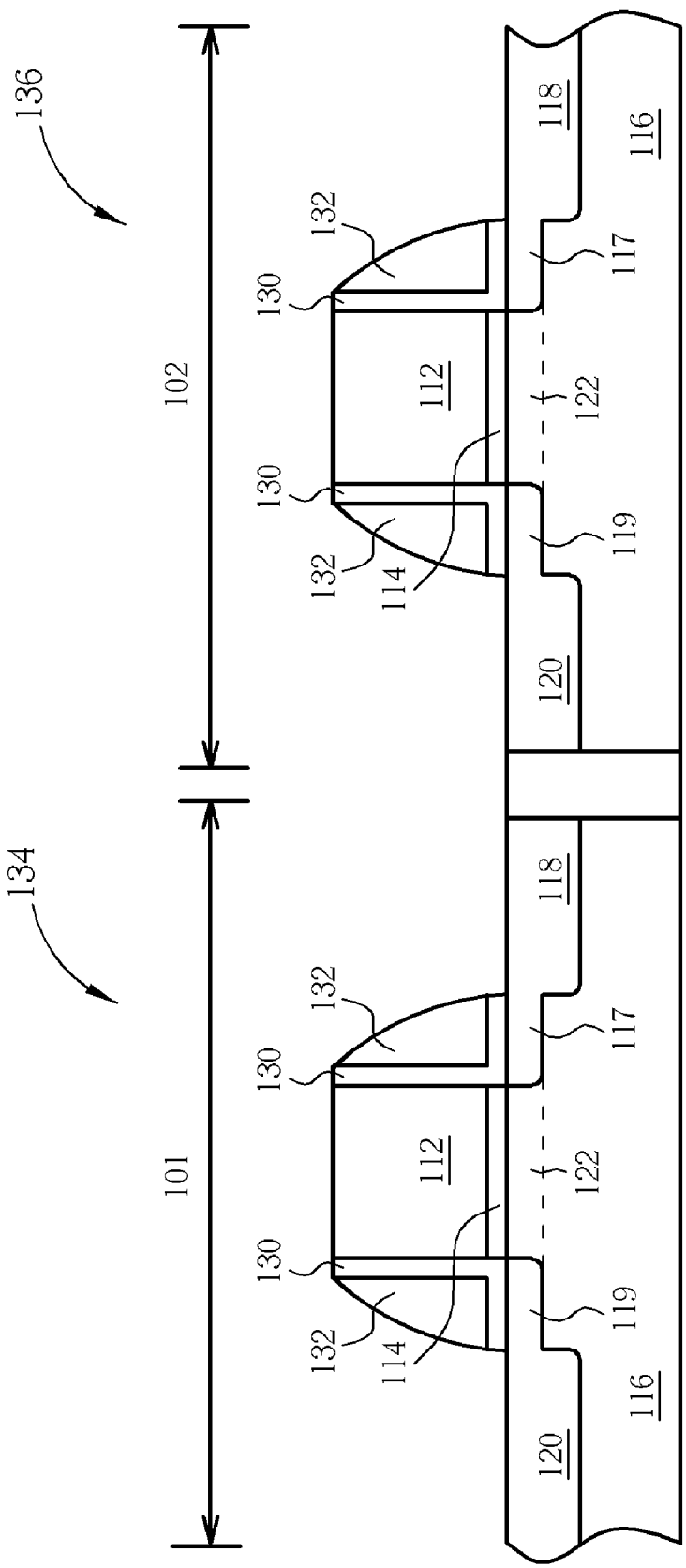

As shown in FIG. 7, after forming the spacers 132, two ion implantation processes are carried out for different active regions to implant different dopants into the semiconductor substrate 110 by utilizing different masks and the gate structures positioned in the first active region 101 and the second active region 102 as implanting masks. Thereby, a source region 118 and a drain region 120 are formed in each active region (the first active region 101 and the second active region 102). For instance, a mask layer (not shown in the figures), such as a photoresist layer, can be formed to mask the second active region 102 only. An ion implantation process is thereafter carried out to dope N-type dopant species, such as arsenic, antimony or phosphorous, into the semiconductor substrate 110 within the first active region 101, and thereby forms a source region 118 and a drain region 120 within the first active region 101. Next, the mask layer within the second active region 102 is stripped off, and a mask layer (not shown in the figures) is formed to cover the first active region 101 only. Furthermore, another ion implantation process is carried out to dope P-type dopant species, such as boron, into the semiconductor substrate 110 within the second active region 102, and thereby forms a source region 118 and a drain region 120 within the second active region 102. The mask layer is then stripped off after performing the ion implantation process.

It is to be understood that the sequence as set before may be reversed. In other words, the P-type doping process for the second active region 102 may be carried out first, and then the N-type doping process for the first active region 101 is performed. After forming the source regions 118 and the drain regions 120, the semiconductor substrate 110 can optionally undergo an activating process, such as a rapid thermal annealing process or an annealing process. The purpose of the activating process is to activate the dopants implanted in the source extensions 117, the drain extensions 119, the source regions 118 and the drain regions 120, and to cure crystal damage induced by the previous active implant process. Since there are other thermal processes included in the subsequent processes, the activating process is not necessary here. The activating process can be performed in a step after a stressed cap layer is formed to activate the dopants implanted in the source extensions 117, the drain extensions 119, the source regions 118 and the drain regions 120.

Figure 8:
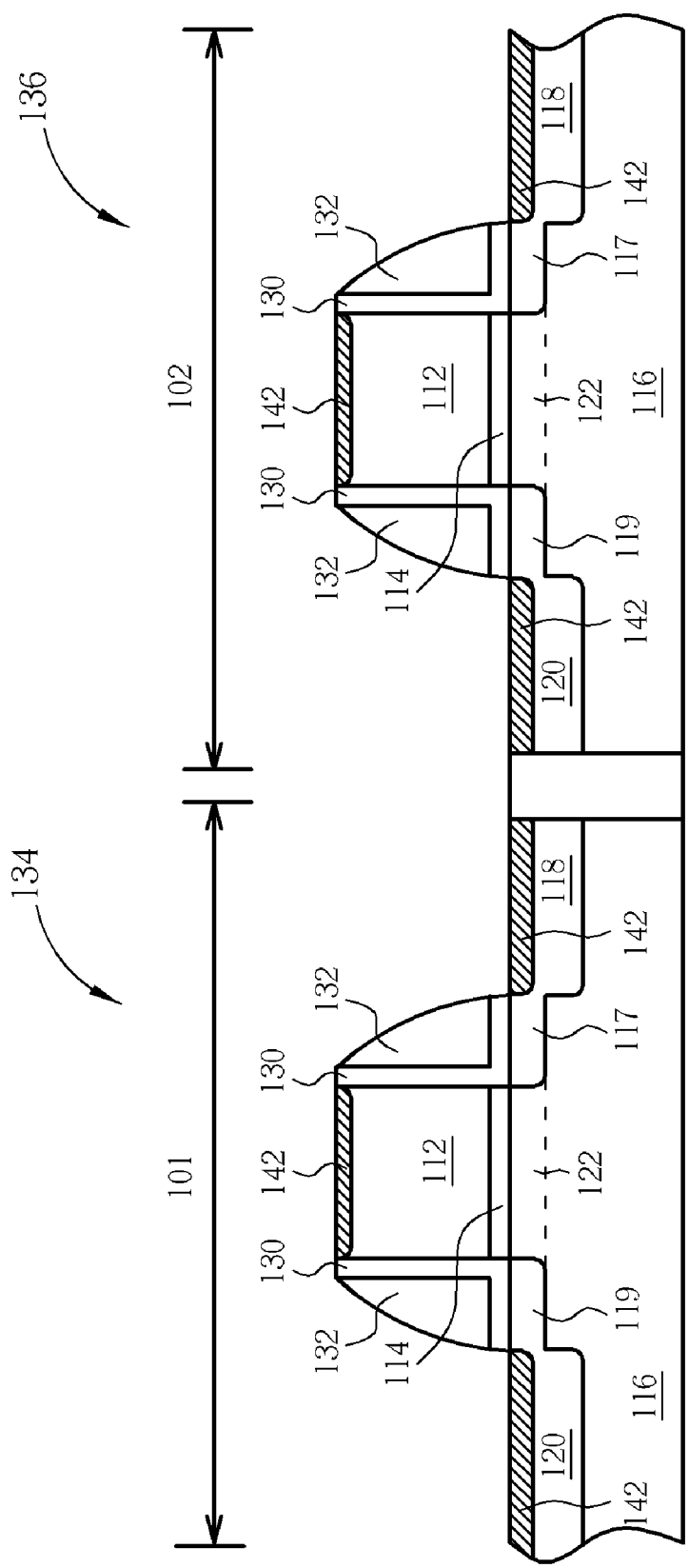

As shown in FIG. 8, afterward, a salicide process is performed. At least a metal layer (not shown in the figures), such as a nickel layer, is sputtered on the surface of the semiconductor substrate 110. The metal layer covers the gates 112, the source regions 118, the drain regions 120 and the semiconductor substrate 110 in the first active region 101 and the second active region 102. Next, a rapid thermal annealing process can be performed to form a salicide layer 142 by reacting the metal layer with the gates 112, the source regions 118 and the drain regions 120 in the first active region 101 and the second active region 102. Furthermore, a selective wet etching process is performed to remove the unreacted metal layer by utilizing mixtures containing $NH_4OH/H_2O_2/H_2O$ (ammonia hydrogen peroxide mixture, APM) or $H_2SO_4/H_2O_2$ (sulfuric acid-hydrogen peroxide mixture, SPM).

Figure 9:
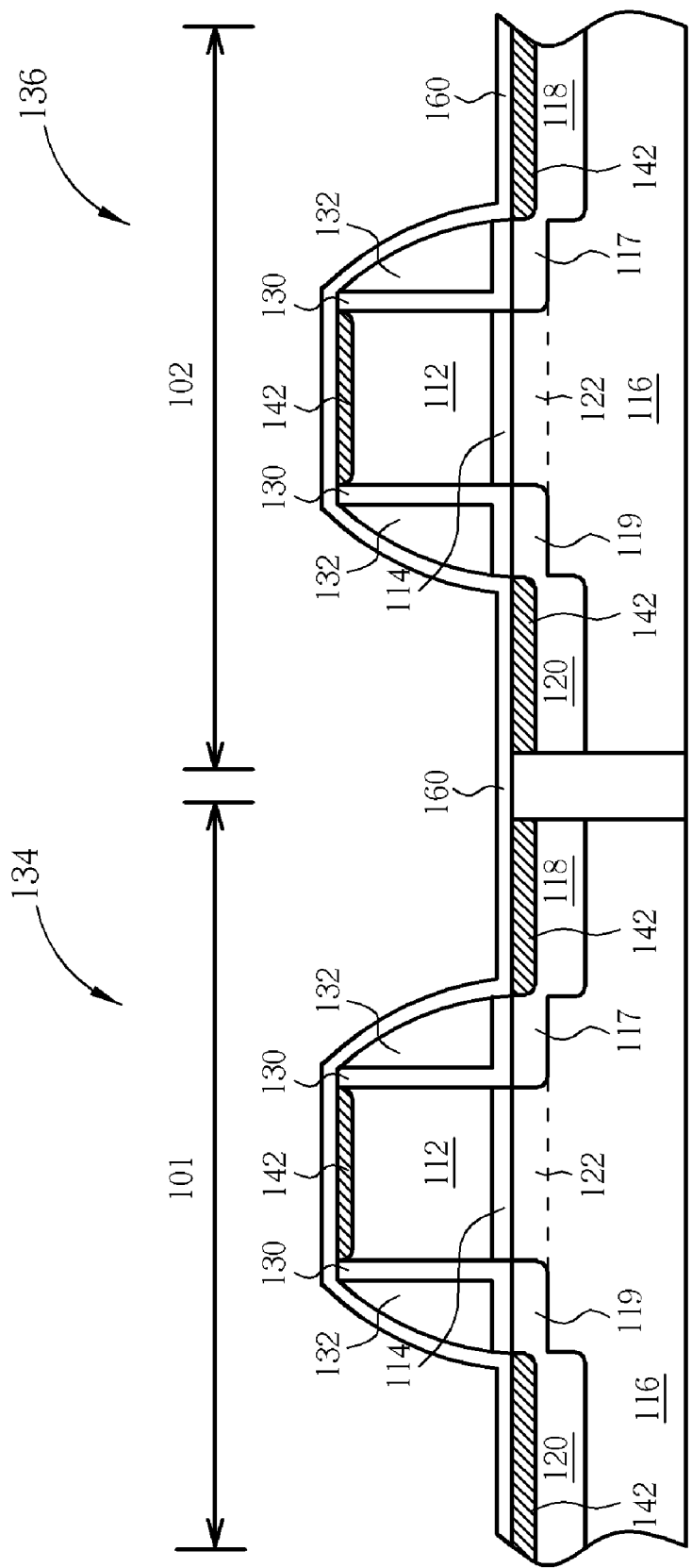

In order to enhance the attaching force between the subsequent silicon nitride stress buffer layer and the semiconductor substrate 110, a lining layer can be formed on the surface of the semiconductor substrate 110 before the deposition process of the stress buffer layer. As shown in FIG. 9, a silicon oxide layer can be formed on the surface of the semiconductor substrate 110 by a deposition process, and acts as a lining layer 160 between the subsequent stress buffer layer and the semiconductor substrate 110. Otherwise, a high temperature oxidation process can be carried out to generally form a high temperature oxide (HTO) as a lining layer 160 between the subsequent stress buffer layer and the semiconductor substrate 110. It should be note that the lining layer 160 is not necessary for the present invention, and the process of forming the lining layer 160 can be omitted as required.

Figure 10:
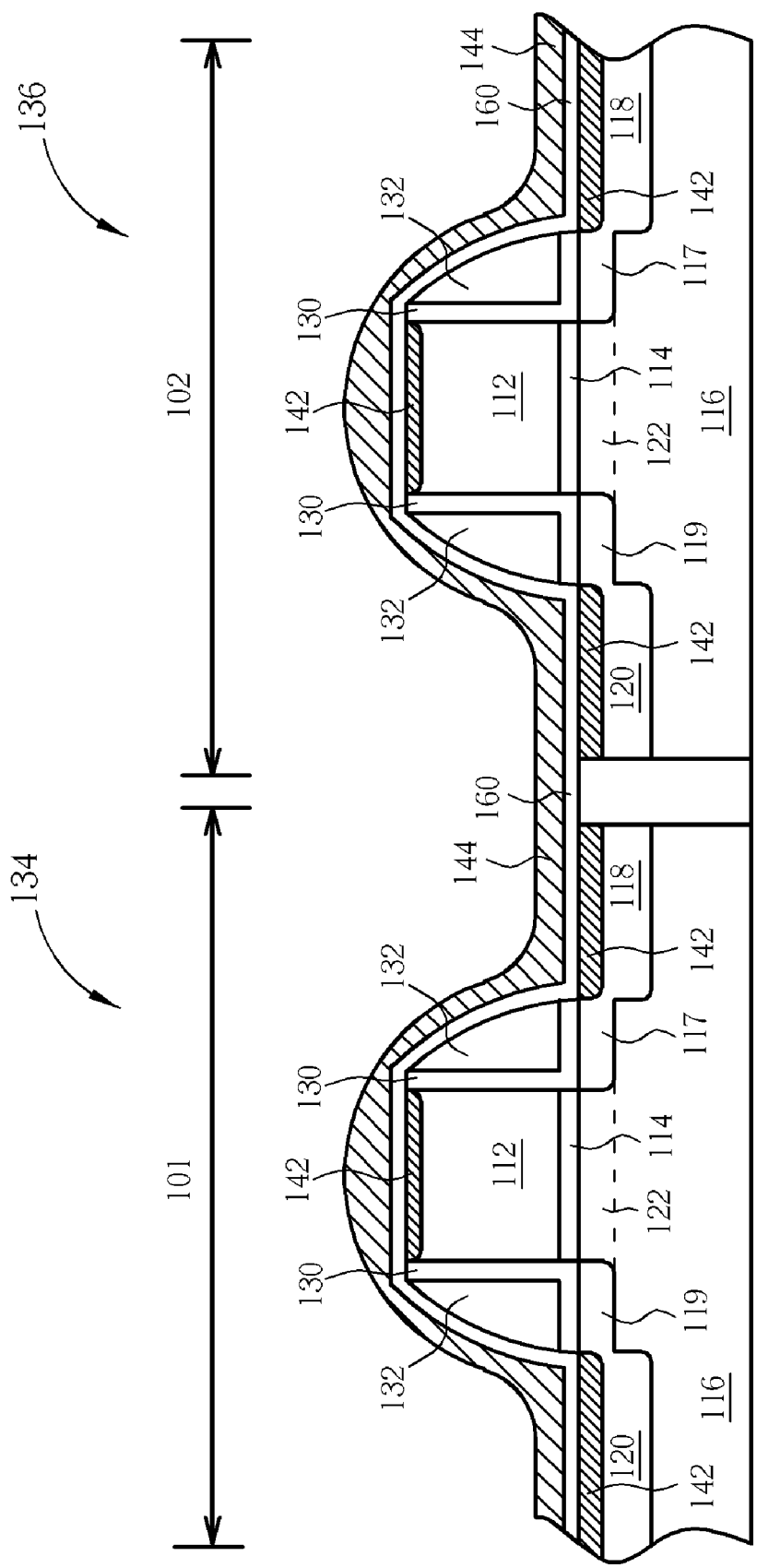

As shown in FIG. 10, a stress buffer layer 144 is formed on the surface of the semiconductor substrate 110, above the spacers 132 and the salicide layer 142, where the tensile stress of the stress buffer layer 144 is smaller than 1.52 GPa. In this preferred embodiment, the stress buffer layer 144 can be a silicon nitride layer, formed by a deposition process, such as a plasma-enhanced chemical vapor deposition (PECVD) process, a sub-atmospheric pressure chemical vapor deposition (SACVD) process, or a high-density plasma chemical vapor deposition (HDCVD) process. Preferably, the thickness of the stress buffer layer 144 is in a range from 10 angstroms to 300 angstroms. Afterward, an activating process, such as a UV curing process, a thermal spike annealing process, an annealing process or an e-beam treatment, is optionally performed on the stress buffer layer 144.

Figure 11:
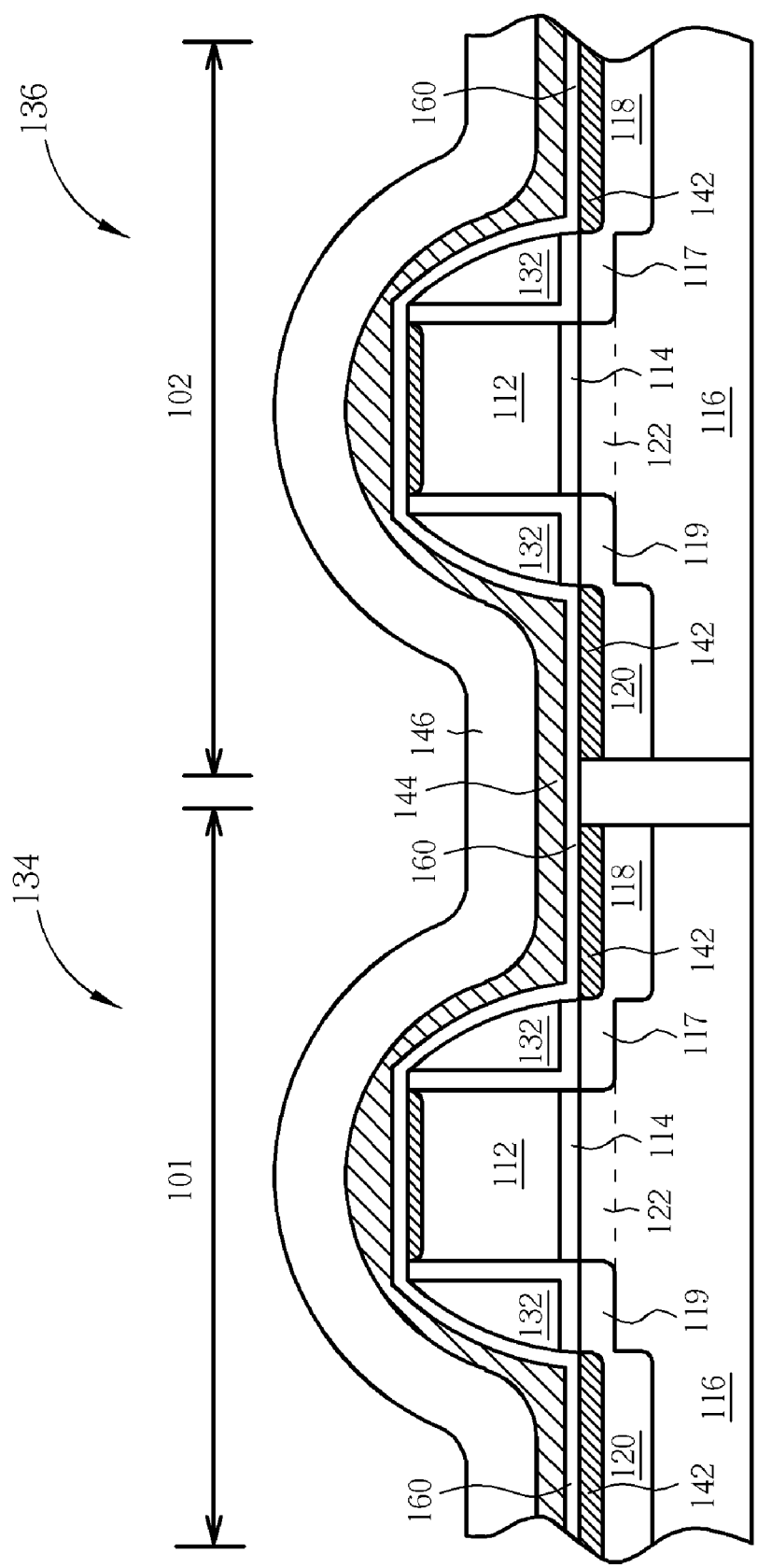

As shown in FIG. 11, subsequently, a stressed cap layer 146 is formed on the stress buffer layer 144 by a plasma-enhanced chemical vapor deposition process, a sub-atmospheric pressure chemical vapor deposition process or a high-density plasma chemical vapor deposition process. In accordance with one aspect of the present invention, the stressed cap layer 146 can be a single-layer structure that includes silicon nitride. Preferably, the thickness of the stressed cap layer 146 is in a range from 20 angstroms to 600 angstroms. For instance, the ratio of the stress buffer layer 144 thickness to the stressed cap layer 146 thickness can be smaller than 0.5. Since the stress buffer layer 144 can prevent the stressed cap layer 146 from breaking, the stress value of the stressed cap layer 146 is no longer limited to the prior art stress value. The tensile stress value of the stressed cap layer 146 can be in a range from 1.0 Gpa to 2.5 Gpa in the present invention, and a tensile stress value beyond 1.52 Gpa is especially preferred. Accordingly, the stress buffer layer 144 and the stressed cap layer 146 can be formed in the same apparatus or in different apparatuses.

It is to be understood by those skilled in the art that the stressed cap layer 146 can optionally undergo some semiconductor processes to change the stress of the stressed cap layer 146 positioned in the second active region 102, to release the tensile stress of the stressed cap layer 146 in the second active region 102, or to enhance a compressive stress of the stressed cap layer 146 in other embodiments. For instance, the alteration of the stress of the stressed cap layer 146 is accomplished by using a germanium ion implantation. The technology of forming a stressed cap layer having multi-stress is called a selective strain scheme (SSS). In the selective strain scheme, a tensile stress and a compressive stress can be combined in one stressed cap layer.

Figure 12:
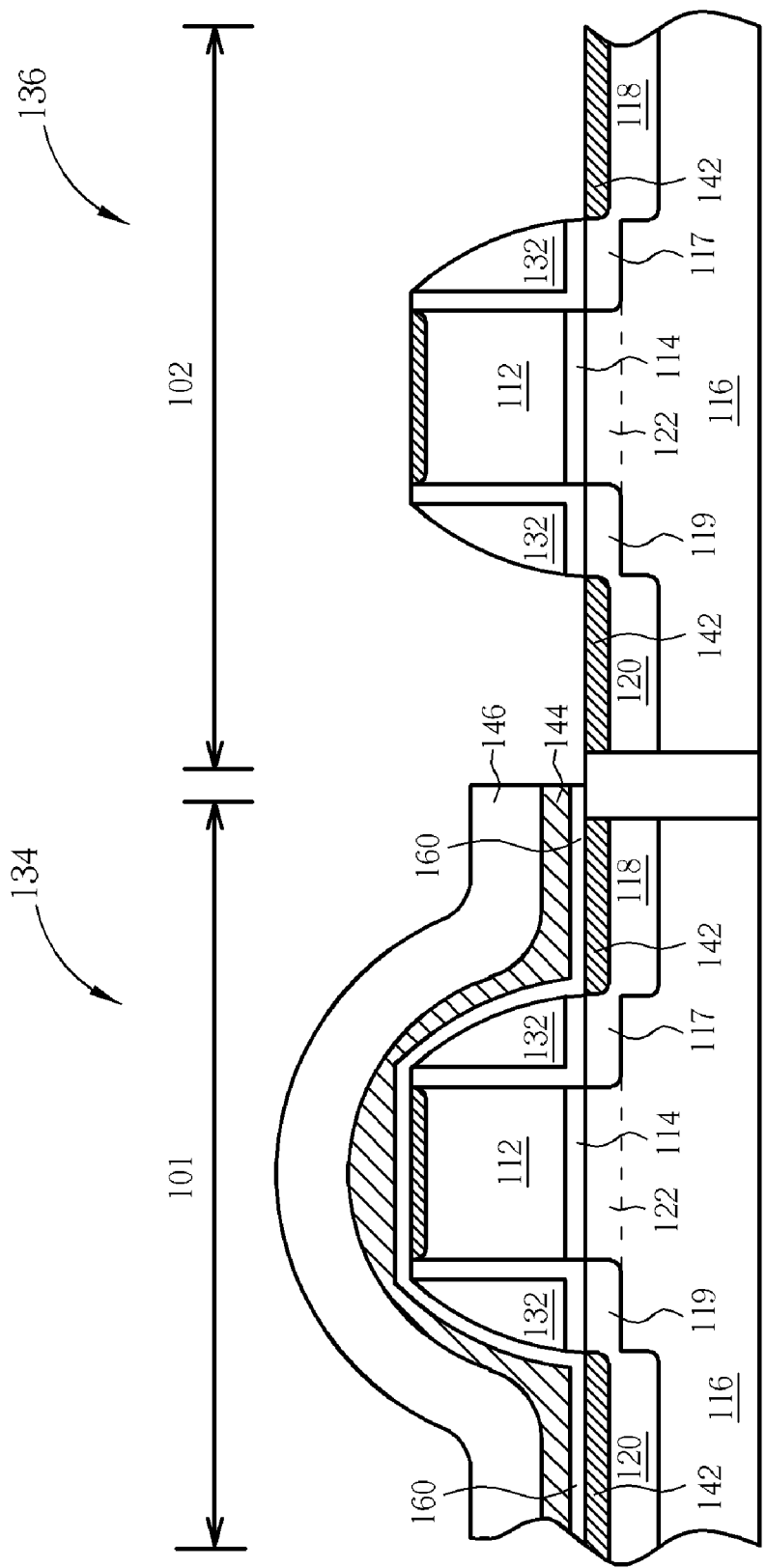

Otherwise, as shown in FIG. 12, because the MOS transistor 136 positioned in the second active region 102 has no need to suffer a tensile stress, the stress buffer layer 144 positioned in the second active region 102 and the stressed cap layer 146 positioned in the second active region 102 can be removed by the lithographic and etching process in this embodiment. As a result, the gate 112, the source region 118 and the drain region 120 in the second active region 102 are exposed, and the stressed cap layer 146 and the stress buffer layer 144 positioned in the first active region 101 remain. Next, an activating process, such as a UV curing process, an annealing process, a thermal spike annealing process or an e-beam treatment, is performed on the stressed cap layer 146 to make the MOS transistor 134 memorize the stress of the stressed cap layer 146 and at the same time to expand the lattice arrangement of the semiconductor substrate 110 in the channel region 122 within the first active region 101. Thus, the electron mobility in the channel region 122 within the first active region 101 is increased, and the driving current of the MOS transistor 134 is therefore raised.

Figure 13:
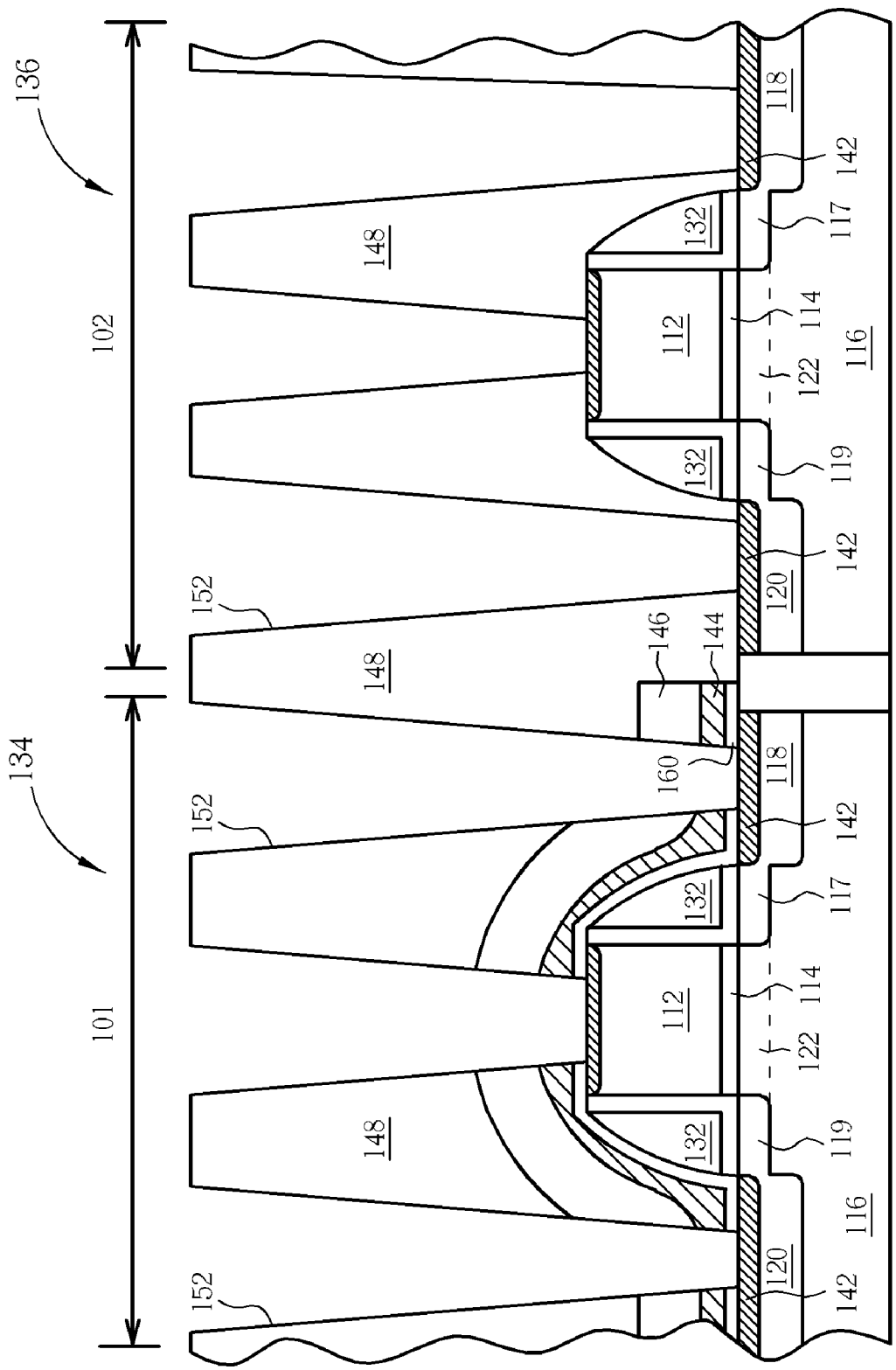

As shown in FIG. 13, a dielectric layer 148 is subsequently deposited over the semiconductor substrate 110. The dielectric layer 148 may include silicon oxide, doped silicon oxide or other suitable materials such as low-k materials. Lithographic and etching processes are thereon carried out on the dielectric layer 148 by utilizing the stressed cap layer 146 as a contact etch stop layer (CESL). When the surface of the stressed cap layer 146 is exposed by the etching process, the process parameters can be adjusted so as to form contact holes 152 in the dielectric layer 148. The contact holes 152 communicate with the gates 112, the source regions 118 and the drain regions 120 of the MOS transistor 134 and the MOS transistor 136. Additionally, those skilled in this art should know that the present invention could be combined with other contact etch stop layers (not shown in the figure). For example, before the dielectric layer 148 is deposited, another contact etch stop layer having compressive-tensile stress (not shown in the figure) can be formed on the MOS transistor 136, so the MOS transistor 134 and the MOS transistor 136 can both be protected by the contact etch stop layers.

According to the general process of forming contact plugs, the contact holes 152 are thereafter filled with at least a conducting material, such as copper, aluminum, tungsten, or alloy thereof so that contact plugs communicating with the MOS transistor 134 and the MOS transistor 136 are formed, and this embodiment is completed.

It should be noticed that the thicknesses mentioned in the present invention are set for a 65 nm process. It is to be understood that all component sizes in the present invention can be changed as required. In other words, as the size of the MOS transistors becomes smaller, the thickness of the stressed cap layer 146 may also become thinner to provide a proper stress.

Figure 14:
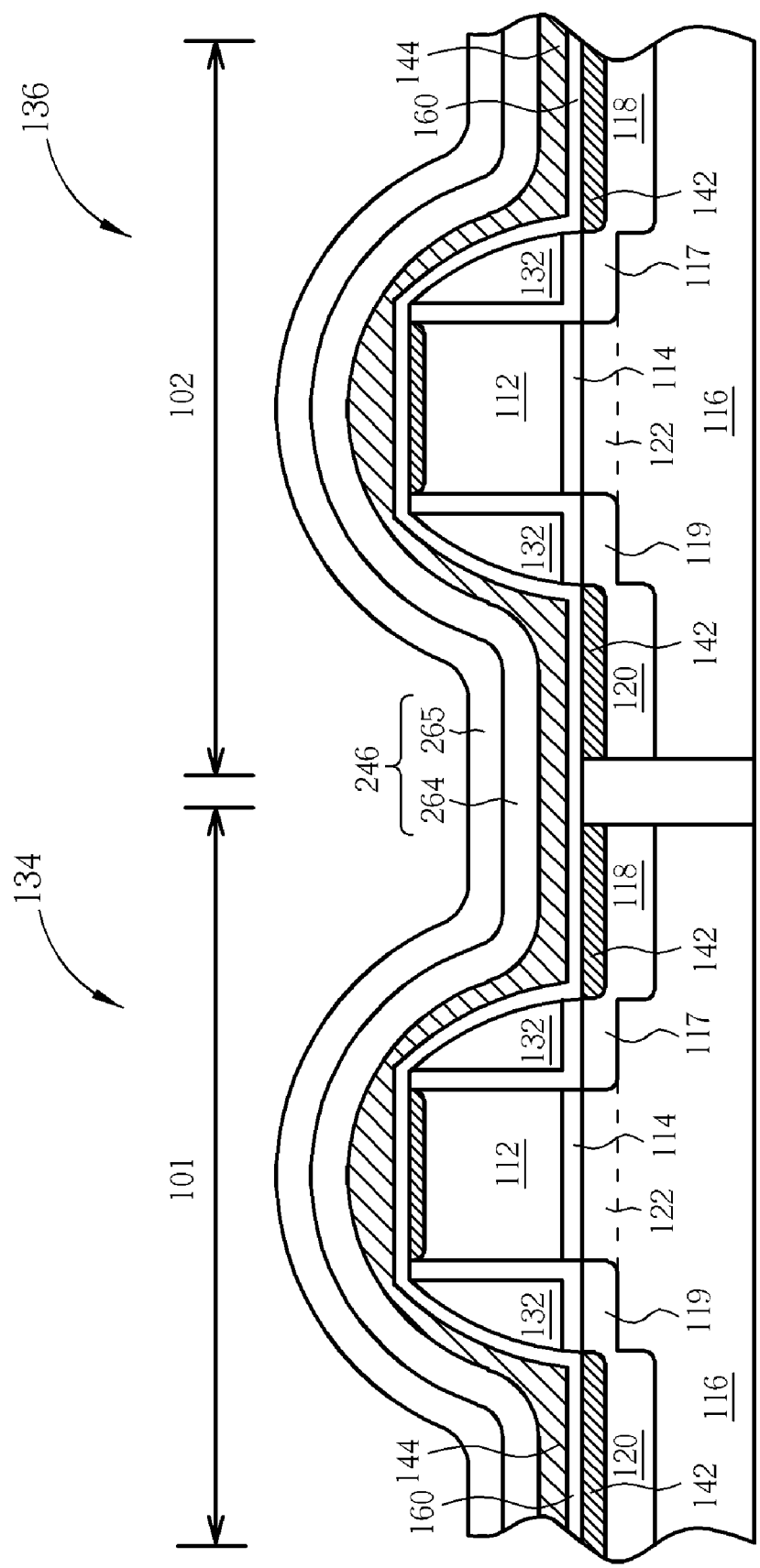
FIG. 14 is a schematic cross-sectional diagram illustrating a method of fabricating MOS transistors in accordance with a second preferred embodiment of the present invention.

In addition, according to another embodiment of this invention, the stressed cap layer 146 can be a multiple-layer structure. Please refer to FIG. 14. FIG. 14 is a schematic cross-sectional diagram illustrating a method of fabricating MOS transistors in accordance with a second preferred embodiment of the present invention, where like number numerals designate similar or the same parts, regions or elements. The main characteristic distinguishing the second preferred embodiment from the first preferred embodiment is that the stressed cap layer 246 in the second preferred embodiment includes a plurality of silicon nitride layers, such as a stack structure containing a silicon nitride layer 264 and a silicon nitride layer 265 thereon. The silicon nitride layer 264 and the silicon nitride layer 265 can be formed by a chemical deposition process, such as a plasma-enhanced chemical vapor deposition (PECVD), a sub-atmospheric pressure chemical vapor deposition (SACVD), or a high-density plasma chemical vapor deposition (HDCVD), and an activating process can be performed on the silicon nitride layer 264 and/or on the silicon nitride layer 265.

Take the manufacturing process of the stressed cap layer 246 shown in FIG. 14 as an example. First, the semiconductor substrate 110 of the second preferred embodiment undergoes the steps or processes shown in FIG. 6 through FIG. 9 according to the first preferred embodiment so as to form the structure shown in FIG. 9, such as the lining layer 160. Subsequently, a stress buffer layer 144 having a thickness about 100 angstroms is formed on the semiconductor substrate 110, and covers the MOS transistor 134 and the MOS transistor 136, where the tensile stress of the stress buffer layer 144 is smaller than 1.52 GPa. Afterward, a silicon nitride layer 264 having an extremely high tensile stress is deposited by means of adjusting the operation parameters of the previous deposition process, and an UV curing process is next optionally performed on the silicon nitride layer 264. For instance, a silicon nitride layer 264 having a tensile stress about 1.73 Gpa can be deposited by increasing the high frequency power of the deposition process, the flow rate of silane ($SiH_4$) reaction gas, and the flow rate of ammonia ($NH_3$) reaction gas. Furthermore, a silicon nitride layer 265 having a relatively lower tensile stress is deposited by means of adjusting the operation parameters of the deposition process again, and another UV curing process is next optionally performed on the silicon nitride layer 265 to finish the manufacturing process of the stressed cap layer 246. For example, a silicon nitride layer 265 having a tensile stress about 1.52 Gpa can be deposited by decreasing the high frequency power of the deposition process, the flow rate of silane gas, and the flow rate of ammonia gas.

Since the tensile stress of the silicon nitride layer 265 is smaller than the tensile stress of the silicon nitride layer 264, the tensile stress of the stressed cap layer 246 increases from top to bottom gradually. It should be understood by a person skilled in this art that the stressed cap layer of the present invention can include less or more silicon nitride layers, such as a stack of five silicon nitride layers, in other embodiments, and the tensile stress of the stressed cap layer in the present invention can decrease from top to bottom gradually. In addition, the tensile stress in a single layer of the stressed cap layer can also increase or decrease from top to bottom gradually by adjusting the operation parameters of the deposition processes or the activating processes in the present invention.

According to the third embodiment of the present invention, the stress buffer layer can include a silicon oxide layer.

Figure 15:
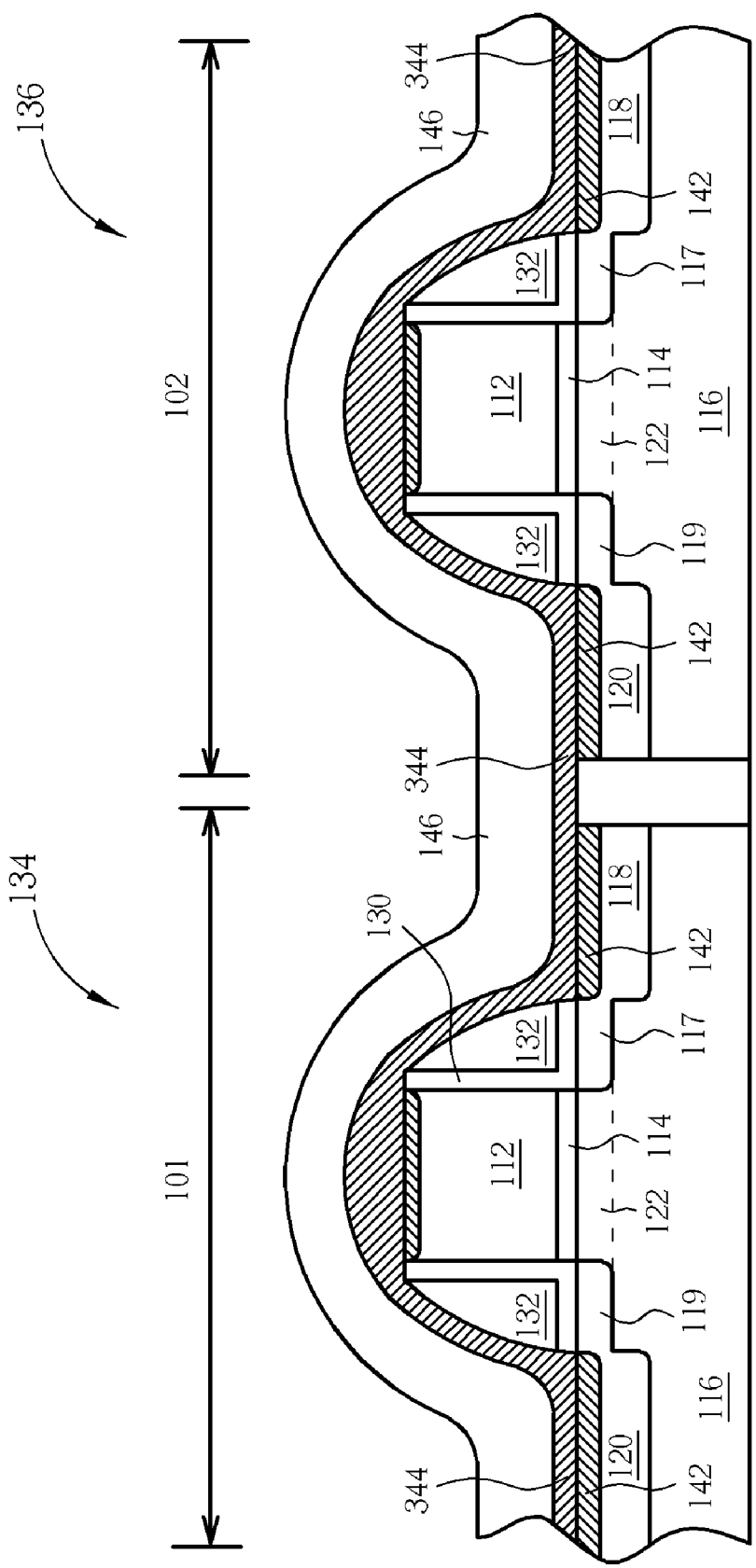
FIG. 15 is a schematic cross-sectional diagram illustrating a method of fabricating MOS transistors in accordance with a third preferred embodiment of the present invention.

Please refer to FIG. 15. FIG. 15 is a schematic cross-sectional diagram illustrating a method of fabricating MOS transistors in accordance with a third preferred embodiment of the present invention, where like number numerals designate similar or the same parts, regions or elements. First, the semiconductor substrate 110 of the third preferred embodiment undergoes the steps or processes shown in FIG. 6 through FIG. 8 according to the first preferred embodiment so as to form the MOS transistor 134, the MOS transistor 136 and the salicide layer 142. Subsequently, as shown in FIG. 15, a stress buffer layer 344 is formed on the semiconductor substrate 110, and covers the spacers 132 and the salicide layer 142, where the tensile stress of the stress buffer layer 344 is also smaller than 1.52 GPa. The main characteristic distinguishing the third preferred embodiment from the first preferred embodiment is that the stress buffer layer 344 in the third preferred embodiment can be a silicon oxide layer. The stress buffer layer 344 has a thickness range from 10 angstroms to 300 angstroms, and can be formed by a plasma-enhanced chemical vapor deposition (PECVD), a sub-atmospheric pressure chemical vapor deposition (SACVD), or a high-density plasma chemical vapor deposition (HDCVD).

Afterward, an activating process, such as a UV curing process, an annealing process, a thermal spike annealing process or an e-beam treatment, is optionally performed on the stress buffer layer 344. Next, a stressed cap layer 146 can be formed, the stressed cap layer 146 and the stress buffer layer 344 positioned in the second active region 102 can be removed, a dielectric layer 148 can be deposited, and contact plugs can be formed in turn according to the steps or processes shown in FIG. 11 through FIG. 13 so as to complete the third preferred embodiment. Since the stress buffer layer 344 is a silicon oxide layer in the third preferred embodiment, the stress buffer layer 344 not only can provide a cushioning effect, but also enhance the adhesion between the semiconductor substrate 110 and the stressed cap layer 146. Thus, the fabricating process of the lining layer 160 can be omitted.

Figure 16:
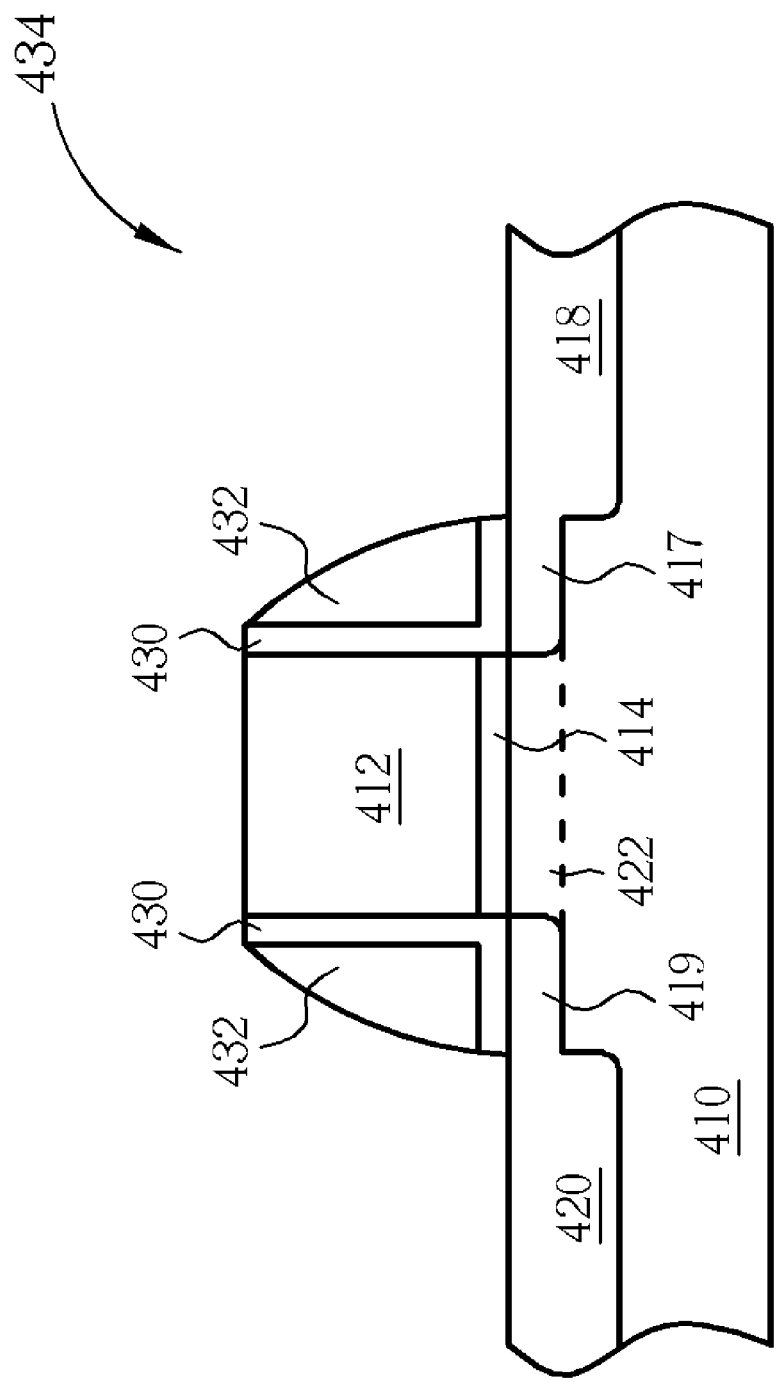
FIG. 16-19 are schematic cross-sectional diagrams illustrating a method of fabricating a MOS transistor in accordance with a fourth preferred embodiment of the present invention.

On other hand, the stressed cap layer of the present invention can be applied to poly stressor technology. Please refer to FIGS. 16-19. FIGS. 16-19 are schematic cross-sectional diagrams illustrating a method of fabricating a MOS transistor in accordance with a fourth preferred embodiment of the present invention. As shown in FIG. 16, a semiconductor substrate 410 is first prepared, and a MOS transistor 434 is thereafter formed on the semiconductor substrate 410.

The MOS transistor 434 can be a NMOS transistor or a PMOS transistor, and has a structure similar to the MOS transistor 134 or the MOS transistor 136 shown in FIG. 7. The MOS transistor 434 includes a gate structure, and the gate structure has a gate dielectric layer 414 and a gate 412 thereon. Furthermore, the MOS transistor 434 can optionally include a spacer 432 and a liner 430 positioned around the sidewall of the gate structure. The channel region 422 of the MOS transistor 434 is located in the semiconductor substrate 410 under the gate structure, and the semiconductor substrate 410 further includes a source region 418 and a drain region 420 on the opposite side of the channel region 422.

Figure 17:
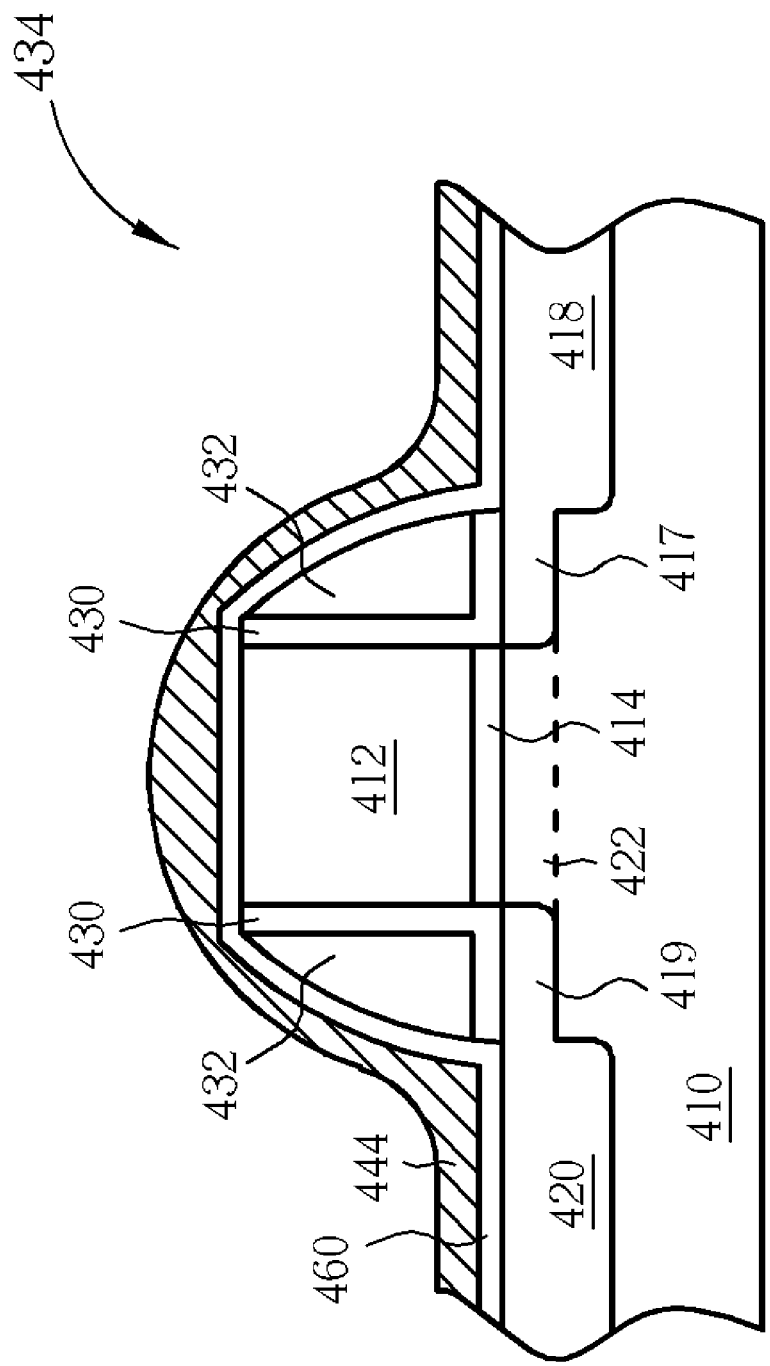

As shown in FIG. 17, a silicon oxide layer can first be formed on the surfaces of the semiconductor substrate 410 by a deposition process, and functions as a lining layer 460 between the subsequent stress buffer layer 444 and the semiconductor substrate 410. Subsequently, a silicon nitride layer is deposited generally on the surface of the semiconductor substrate 410 as a stress buffer layer 444. Otherwise, a high temperature oxidation process can first be carried out to generally form a high temperature oxide (HTO) as a lining layer (not shown in the figure) between the subsequent stress buffer layer 444 and the semiconductor substrate 410, and a silicon nitride layer is subsequently deposited generally on the surface of the semiconductor substrate 410 as a stress buffer layer 444. After forming the stress buffer layer 444, the semiconductor substrate 410 can optionally undergo an activating process, such as a UV curing process, an annealing process or an e-beam treatment.

In this embodiment, the stress buffer layer 444 can be a silicon nitride layer or a silicon oxide layer, formed by a deposition process, such as a plasma-enhanced chemical vapor deposition process, a sub-atmospheric pressure chemical vapor deposition process, or a high-density plasma chemical vapor deposition process. Preferably, the tensile stress value of the stress buffer layer 444 is beyond 1.52 Gpa, and the thickness of the stress buffer layer 444 is in a range from 10 angstroms to 300 angstroms. It should be note that, no matter if the stress buffer layer 444 is a silicon nitride layer or a silicon oxide layer, the process of forming a lining layer 460 can be omitted.

Figure 18:
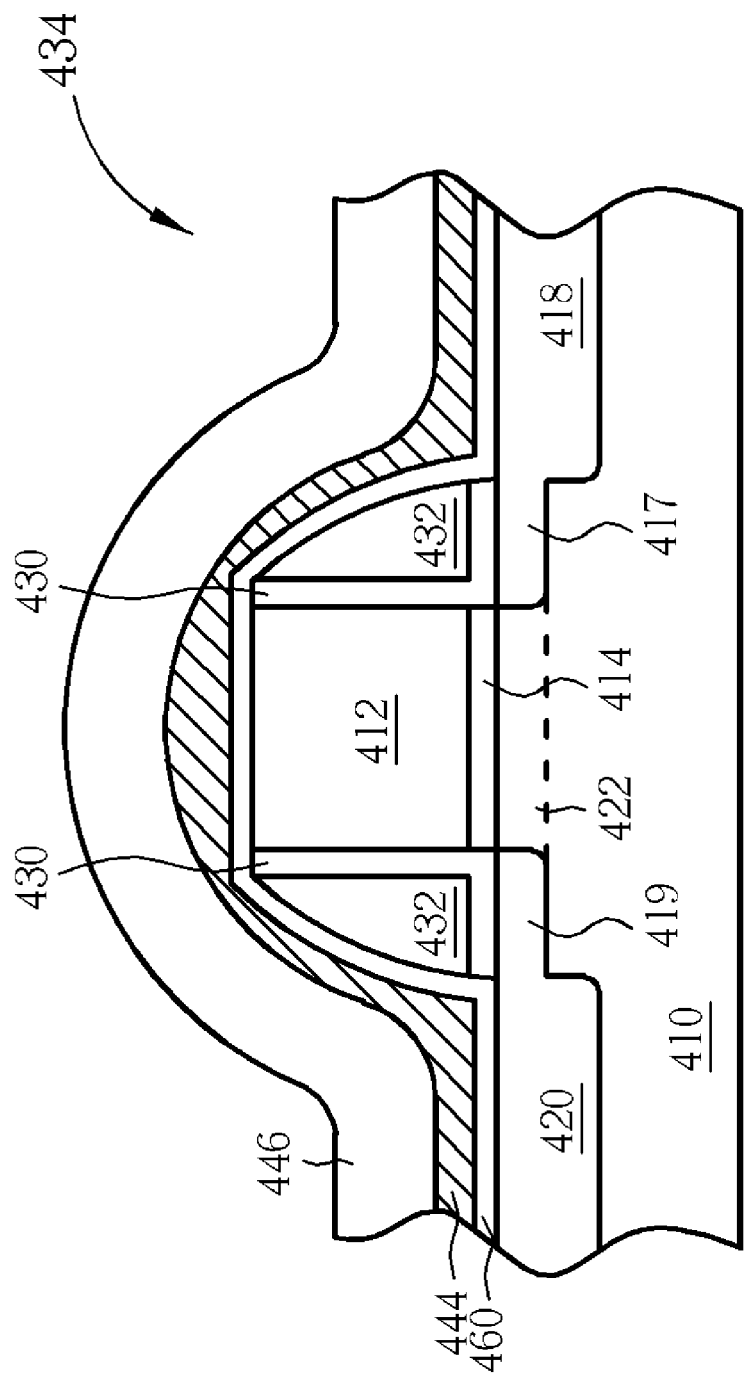

As shown in FIG. 18, a stressed cap layer 446 is thereafter formed on the stress buffer layer 444 by a plasma-enhanced chemical vapor deposition process, a sub-atmospheric pressure chemical vapor deposition process or a high-density plasma chemical vapor deposition process. In accordance with one aspect of the present invention, the stressed cap layer 446 can include a silicon nitride layer. Preferably, the tensile stress value of the stressed cap layer 446 is in a range from 1.0 Gpa to 2.5 Gpa, and the ratio of the stress buffer layer 444 thickness to the stressed cap layer 446 thickness can be smaller than 0.5. Next, an activating process, such as a UV curing process, an annealing process or an e-beam treatment, is performed on the stressed cap layer 446 to make the MOS transistor 434 memorize the stress of the stressed cap layer 446 and at the same time to expand the lattice arrangement of the semiconductor substrate 410 in the channel region 422. Thus, the electron mobility in the channel region 422 is increased, and the driving current of the MOS transistor 434 is therefore raised.

Figure 19:
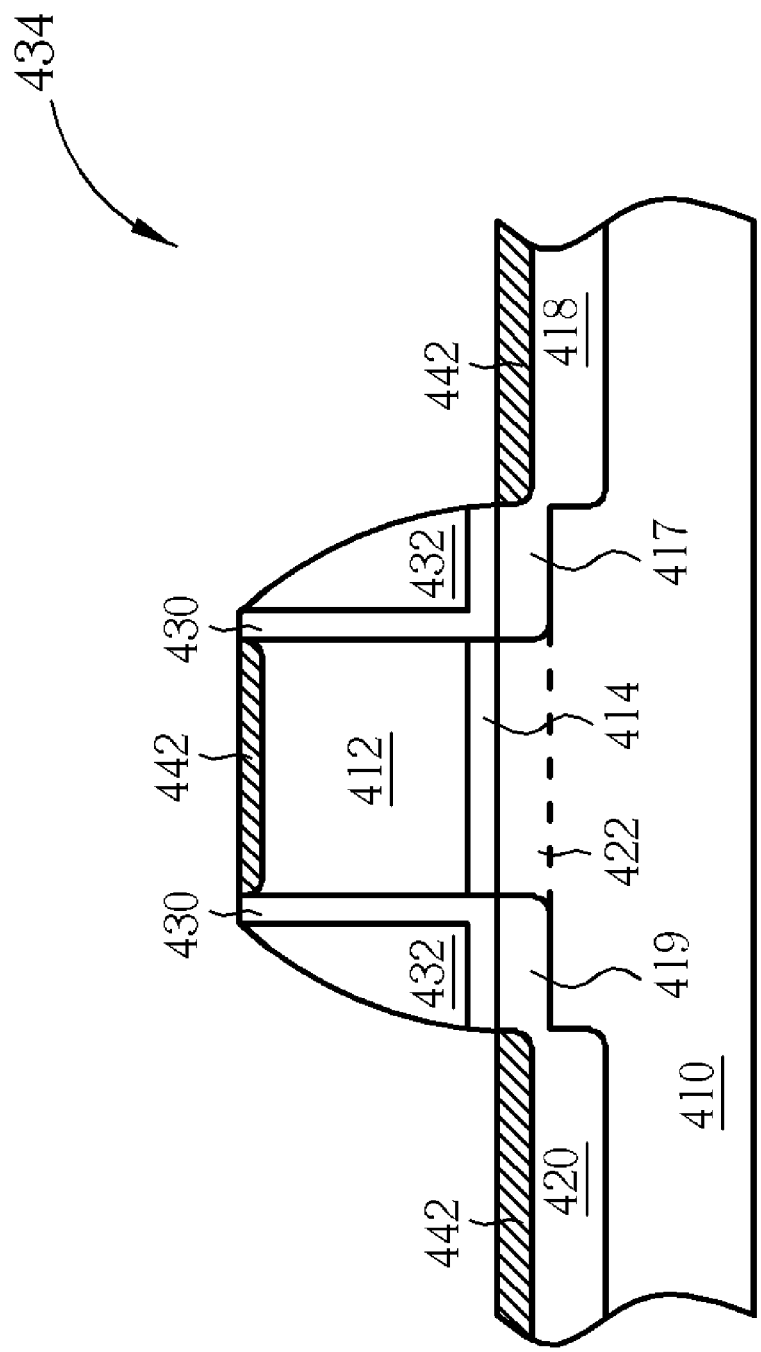

As shown in FIG. 19, afterward, an etching process is performed to remove the lining layer 460, the stressed cap layer 446 and the stress buffer layer 444. Thereafter, a salicide process is performed. At least a metal layer (not shown in the figures) is sputtered on the surface of the semiconductor substrate 410. The metal layer covers the surfaces of the gate 412, the source region 418, the drain region 420 and the semiconductor substrate 410. Next, a rapid thermal annealing process can be performed to form a salicide layer 442 by reacting the metal layer with the gate 412, the source region 418 and the drain region 420. Furthermore, a selective wet etching process is performed to remove the unreacted metal layer by utilizing mixtures containing APM or SPM.

Figure 20:
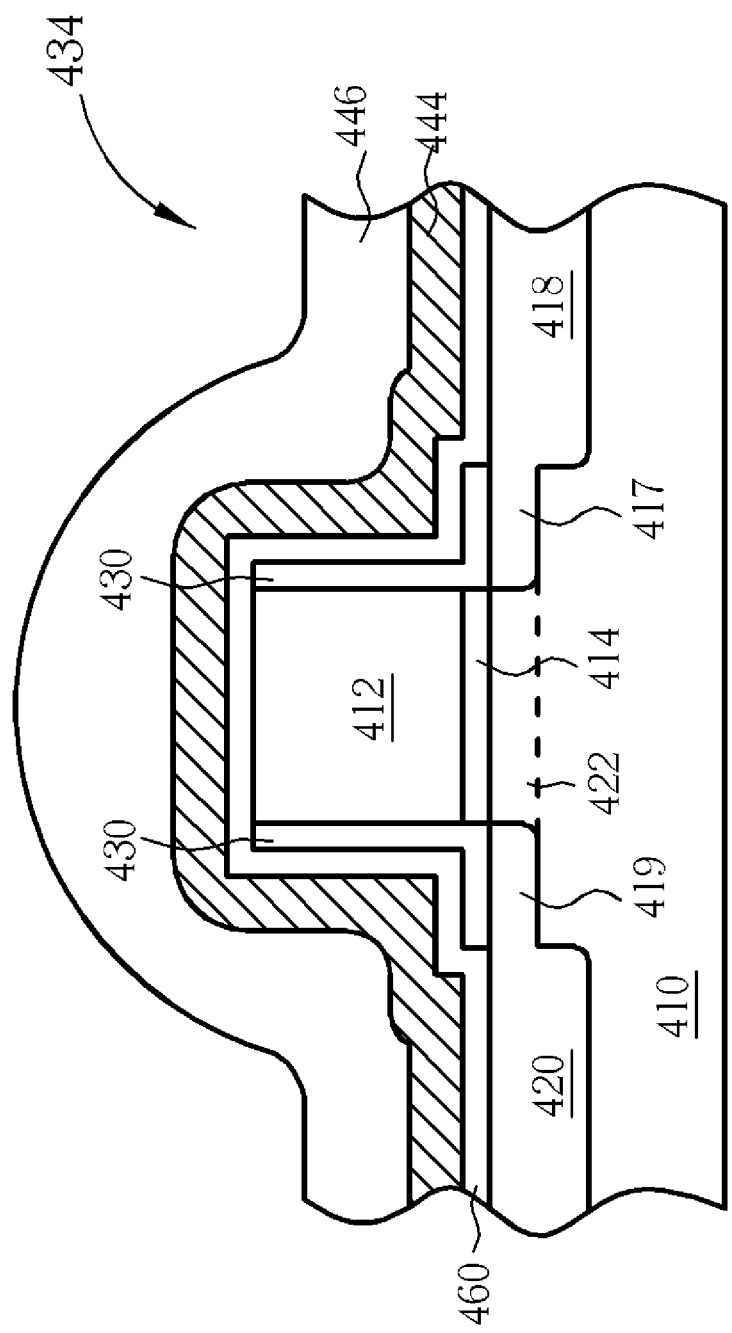
FIG. 20 is a schematic cross-sectional diagram illustrating a method of fabricating a MOS transistor in accordance with a fifth preferred embodiment of the present invention.
Figure 21:
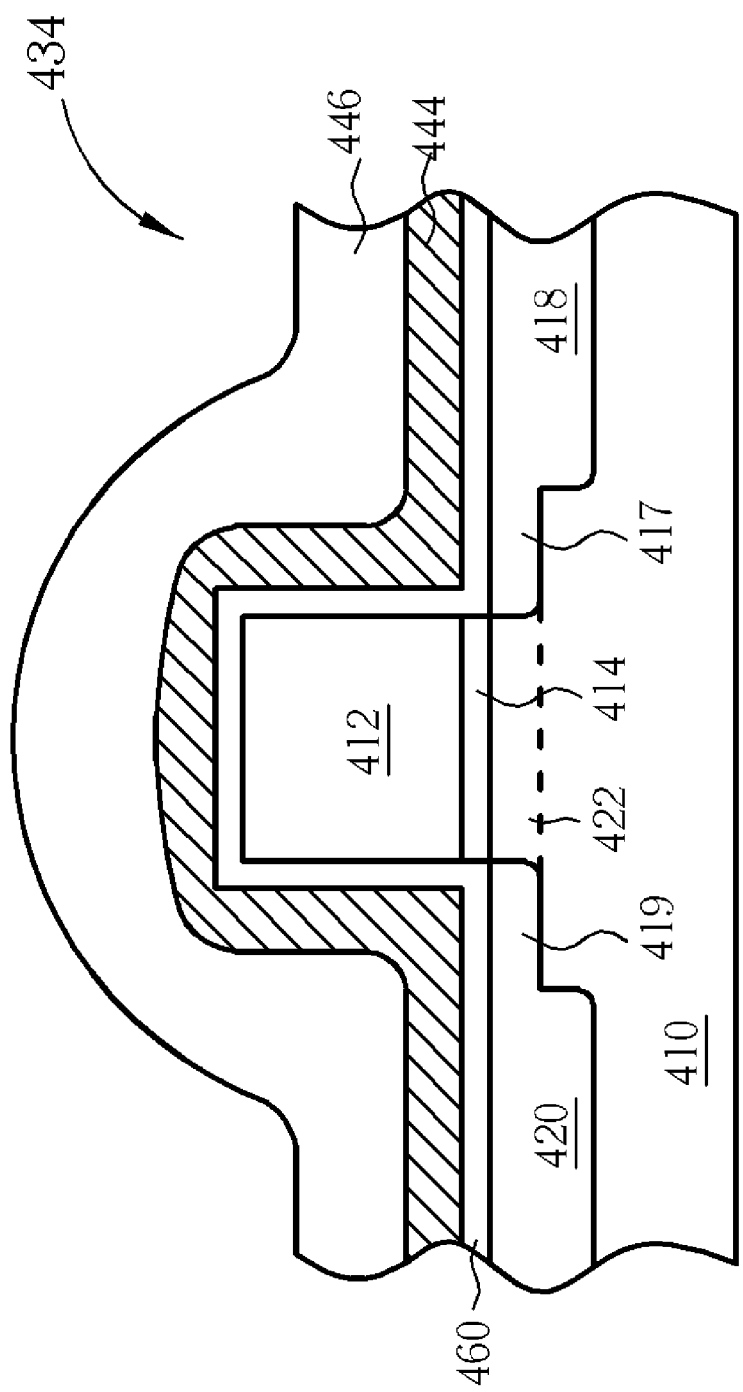
FIG. 21 is a schematic cross-sectional diagram illustrating a method of fabricating a MOS transistor in accordance with a sixth preferred embodiment of the present invention.

It should be noted that the stress buffer layer of the present invention, or the lining layer positioned under the stress buffer layer can directly cover a gate structure, which contains no spacer. Please refer to FIG. 20 and FIG. 21. FIG. 20 is a schematic cross-sectional diagram illustrating a method of fabricating a MOS transistor in accordance with a fifth preferred embodiment of the present invention, and FIG. 21 is a schematic cross-sectional diagram illustrating a method of fabricating a MOS transistor in accordance with a sixth preferred embodiment of the present invention, where like number numerals designate similar or the same parts, regions or elements.

According to the fifth embodiment of the present invention, the spacer 432 can be optionally stripped away before the stress buffer layer 444 or the lining layer 460 is deposited, and the liner 430 having a L-shape is maintained on the sidewall of the gate 412. Next, a lining layer 460 can be formed, a stress buffer layer 444 is formed, a stressed cap layer 446 can be formed, an activating process can be carried out, the stressed cap layer 446 and the stress buffer layer 444 can be removed, and a salicide layer 442 can be formed in turn according to the steps or processes shown in FIG. 17 through FIG. 19 so as to complete the fifth preferred embodiment. Accordingly, the lining layer 460 can directly cover the surface of the gate structure, which contains no spacer, so the stressed cap layer 446 can affect the MOS transistor 434 more effectively, as shown in FIG. 20. Furthermore, as shown in FIG. 21, the spacer 432 and the liner 430 can even be completely removed, and a gate 412, which does not contain any spacer or any liner, remains. Next, the steps or processes shown in FIG. 17 through FIG. 19 are performed in turn to complete the sixth preferred embodiment.

From one aspect of the present invention, the stress buffer layer is first formed, and the stressed cap layer is next formed on the stress buffer layer so that the MOS transistor can have strain in its structure. On one hand, the stress buffer layer covers the turning point of the MOS transistor at the joint between the gate structure and the semiconductor substrate, so an outer surface of the semiconductor substrate is flatter and blunter. As a result, the stressed cap layer has a flatter structure, so the present invention can prevent the stressed cap layer from breaking or cracking. On the other hand, the stress buffer layer covering the MOS transistor can have a tensile stress therein. The stress buffer layer not only can provide a cushioning effect from the stressed cap layer, but also provides some stress for the MOS transistor, preventing the stressed cap layer from contacting the MOS transistor directly.

Since the stress buffer layer can prevent the stressed cap layer from breaking, the MOS transistor device can be covered by a stressed cap layer having an extremely high tensile stress in the present invention, and the stressing function of the stressed cap layer can be ensured at the same time. Hence, the stressed cap layer can affect the MOS transistor more strongly, and changes a lattice constant of the channel region. The channel region of the MOS transistor suffers the extremely high tensile stress, which is provided by the stressed cap layer, along a direction parallel to the channel region, so the present invention can increase a drive current of the MOS transistor, and develop the performance of the MOS transistor. According to the experiment data, the present invention can increase an ion gain percentage of the MOS transistor by at least 3% from the prior art MOS transistor. In addition, the stressed cap layer can function as a salicide block in the salicide process so that the processes of forming the MOS transistor are simplified.

Those skilled in the art will readily observe that numerous modifications and alterations of the device and method may be made while retaining the teachings of the invention.

What is claimed is:

1. A MOS (metal-oxide-semiconductor) transistor, comprising:
   a semiconductor substrate;
   a gate structure positioned on the semiconductor substrate;
   a source region positioned in the semiconductor substrate;
   a drain region positioned in the semiconductor substrate;
   a channel region disposed in the semiconductor substrate under the gate structure, positioned between the source region and the drain region;
   a stress buffer layer covering the gate structure, the source region and the drain region; and a stressed cap layer covering the stress buffer layer, and a tensile stress of the stressed cap layer being larger than a tensile stress of the stress buffer layer.

2. The MOS transistor according to claim 1, wherein the MOS transistor is an NMOS transistor or a PMOS transistor.

3. The MOS transistor according to claim 1, wherein the gate structure comprises:

a gate dielectric layer positioned on the semiconductor substrate;

a gate positioned on the gate dielectric layer; and a spacer adjacent to a sidewall of the gate.

4. The MOS transistor according to claim 1, wherein the gate structure comprises:

a gate dielectric layer positioned on the semiconductor substrate; and a gate without a spacer, positioned on the gate dielectric layer.

5. The MOS transistor according to claim 1, wherein a thickness of the stress buffer layer is in a range from 10 to 300 angstroms.

6. The MOS transistor according to claim 1, wherein the tensile stress of the stress buffer layer is smaller than 1.52 GPa.

7. The MOS transistor according to claim 1, wherein the stressed cap layer comprises a silicon nitride layer.

8. The MOS transistor according to claim 1, wherein the stressed cap layer comprises a multiple-layer structure.

9. The MOS transistor according to claim 1, wherein the tensile stress of the stressed cap layer decreases from top to bottom gradually.

10. The MOS transistor according to claim 1, wherein a ratio of a thickness of the stress buffer layer to a thickness of the stressed cap layer is smaller than 0.5.

11. The MOS transistor according to claim 1, wherein the stress buffer layer comprises a silicon oxide layer.

12. The MOS transistor according to claim 1, wherein the stress buffer layer comprises a silicon nitride layer.

13. The MOS transistor according to claim 12, further comprising a silicon oxide layer positioned under the stress buffer layer, wherein the silicon oxide layer covers the gate structure, the source region and the drain region.

* * * * *